US012805278B2

(12) United States Patent
Lu et al.

(10) Patent No.: US 12,805,278 B2
(45) Date of Patent: Nov. 17, 2026

(54) PROTECTION STRUCTURE FOR LINER REMOVAL

(71) Applicant: Tokyo Electron Limited, Tokyo (JP)

(72) Inventors: Yen-Tien Lu, Albany, NY (US); Nicholas Joy, Albany, NY (US); Shihsheng Chang, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 259 days.

(21) Appl. No.: 18/441,719

(22) Filed: Feb. 14, 2024

(65) Prior Publication Data

US 2025/0259891 A1 Aug. 14, 2025

(51) Int. Cl.

*H10W 20/00* (2026.01)
*H10P 50/00* (2026.01)
*H10P 50/26* (2026.01)
*H10P 70/00* (2026.01)

(52) U.S. Cl.

CPC ......... *H10W 20/054* (2026.01); *H10P 50/267* (2026.01); *H10P 50/71* (2026.01); *H10P 70/273* (2026.01)

(58) Field of Classification Search

None

See application file for complete search history.

(56) References Cited

U.S. PATENT DOCUMENTS 7,651,942 B2 * 1/2010 Huebinger .......... H10W 20/085 438/638
9,214,348 B2 12/2015 Son et al.
11,121,027 B2 9/2021 Lu et al.
11,742,241 B2 8/2023 Sun et al.
2011/0108517 A1 * 5/2011 Luong .................... H10P 50/73 216/6

(Continued)

FOREIGN PATENT DOCUMENTS

KR 20140028912 A 3/2014

OTHER PUBLICATIONS

International Searching Authority, "Notification of Transmittal of the International Search Report and the Written Opinion of the International Searching Authority, or the Declaration," PCT/US2024/060058, mailed Apr. 16, 2025, 11 pages.

(Continued)

*Primary Examiner* — Binh X Tran

(74) *Attorney, Agent, or Firm* — Slater Matsil, LLP

(57) ABSTRACT

A method of etching a liner formed between a patterned layer and a substrate includes forming a conformal protection layer over the patterned layer and the liner, dry etching the liner to expose the substrate using the patterned layer as an etch mask, and wet etching and removing the conformal protection layer. A mask protection structure may be formed at upper surfaces of the patterned layer before dry etching the liner, before or after forming the conformal protection layer. The conformal protection layer may be formed using an atomic layer deposition process. The patterned layer may include a hardmask and a patterned interconnect layer, such as a patterned ruthenium interconnect layer. The substrate may include silicon. Wet etching and removing the conformal protection layer may be part of a cleaning process. The wet etchant may include hydrofluoric acid (HF).

20 Claims, 8 Drawing Sheets

(203)

(56) References Cited

U.S. PATENT DOCUMENTS

| | | | | |
|---|---|---|---|---|
| 2015/0087150 | A1* | 3/2015 | Wang | H10P 50/695 438/696 |
| 2017/0053835 | A1 | 2/2017 | Sung et al. | |
| 2022/0020642 | A1 | 1/2022 | Sun et al. | |
| 2022/0122986 | A1 | 4/2022 | Jang et al. | |
| 2024/0222278 | A1* | 7/2024 | Nogami | H10W 20/072 |

OTHER PUBLICATIONS

J. Oh et al., "Etch Behavior of ALD Al2O3 on HfSiO and HfSiON Stacks in Acidic and Basic Etchants", Journal of The Electrochemical Society, vol. 158, No. 4, Feb. 2011, 6 pages.

M. Winterkorn et al., "Etch Rate Characterization of Oxide Ald Films," ALD2019 Session AF5-MoP: Characterization of ALD Films Poster Session, Jul. 2019,1 page.

* cited by examiner

PROTECTION STRUCTURE FOR LINER REMOVAL

TECHNICAL FIELD

The present invention relates generally to etching processes, and, in particular embodiments, to systems and methods for etching a liner formed between a patterned layer and a substrate using a conformal protection layer.

BACKGROUND

Microelectronic device fabrication typically involves a series of manufacturing techniques that include formation, patterning, and removal of a number of layers of material on a substrate. Etch masks may be formed (e.g., deposited, grown, patterned) to protect regions of the substrate and allow for pattern transfer via etching. Wet or dry etching processes may be used, with plasma etching processes being an example of a dry etching process.

The different types of etching processes have associated advantages and disadvantages. For example, wet etching processes are often isotropic (i.e., etch in all directions substantially evenly), fast, simple, and can be highly selective. However, etching in a specific direction (e.g., vertically) is often desirable and wet etching processes struggle to accurately produce complex and/or small patterns. In contrast, dry etching processes (which often use plasma) are typically anisotropic (i.e., etching occurs faster in a certain direction, usually vertically), are comparatively slower, often require complex equipment and control, and can have lower selectivity than wet etching processes.

SUMMARY

In accordance with an embodiment of the invention, a method of etching a liner formed between a patterned layer and a substrate includes forming a conformal protection layer over the patterned layer and the liner, dry etching the liner to expose the substrate using the patterned layer as an etch mask, and wet etching and removing the conformal protection layer.

In accordance with another embodiment of the invention, a method of etching a liner formed between a patterned layer and a substrate includes forming a conformal protection layer over the patterned layer and the liner, forming a mask protection structure on upper surfaces of features of the patterned layer, dry etching the liner to expose the substrate using the mask protection structure as an etch mask, and wet etching and removing the conformal protection layer.

In accordance with still another embodiment of the invention, a method of etching a ceramic liner formed between a patterned ruthenium interconnect layer and a silicon-containing substrate includes forming an atomic layer deposition (ALD) protection layer over the ceramic liner, the patterned ruthenium interconnect layer, and a hardmask formed thereon, forming a silicon-containing mask protection structure selectively over upper surfaces of features of the hardmask, dry etching the ceramic liner to expose the silicon-containing substrate using the silicon-containing mask protection structure and the hardmask as a liner etch mask using plasma including boron and chlorine or including a fluorocarbon, and cleaning the patterned ruthenium interconnect layer to remove the ALD protection layer using a wet etchant.

BRIEF DESCRIPTION OF THE DRAWINGS

For a more complete understanding of the present invention, and the advantages thereof, reference is now made to the following descriptions taken in conjunction with the accompanying drawings, in which:

FIG. 1A shows an initial state of a patterned layer overlying a liner, FIG. 1B shows the conformal deposition of a protection layer over the patterned layer, FIG. 1C shows the dry etch of the liner, and FIG. 1D shows the wet etch that removes the protection layer in accordance with embodiments of the invention;

FIG. 2A shows a preliminary etch of a target layer to form a patterned layer, FIG. 2B shows an initial state of the patterned layer overlying a liner, FIG. 2C shows the conformal deposition of a protection layer over the patterned layer, FIG. 2D shows the mask growth of a protection structure over the patterned layer, FIG. 2E shows the dry etch of the liner, and FIG. 2F shows the wet etch that removes the protection layer in accordance with embodiments of the invention;

FIG. 3A shows an initial state of a patterned layer overlying a liner, FIG. 3B shows the mask growth of a protection structure over the patterned layer, FIG. 3C shows the conformal deposition of a protection layer over the protection structure and the patterned layer, and FIG. 3D shows the dry etch of the liner in accordance with embodiments of the invention;

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope. Unless specified otherwise, the expressions “around”, “approximately”, and “substantially” signify within 10%, and preferably within 5% of the given value or, such as in the case of substantially zero, less than 10% and preferably less than 5% of a comparable quantity.

Microelectronic device fabrication (e.g., semiconductor device fabrication) utilizes complex patterns formed from multiple layers of different materials. Each of the materials and structures have different properties that enable the fulfilment of a desired purpose, but also require careful planning in order to successfully process the various materials in the presence of other materials. In many cases it can be difficult to achieve the desired result for one structure while avoiding negative impacts to surrounding structures.

One example of a multilayer structure is a liner formed between a patterned layer and a substrate. The patterned layer may be electrically conductive (e.g., an interconnect layer) while the substrate may contain various devices connected to other by the arrangement of the patterned layer. A liner may be included between the patterned layer and the substrate for a variety of reasons, including as a barrier layer to prevent diffusion, an adhesion layer to improve the bonding between the materials, to prevent electron tunneling between layers (e.g., when metal or other materials with free electrons are involved), and others.

Figure 6A:
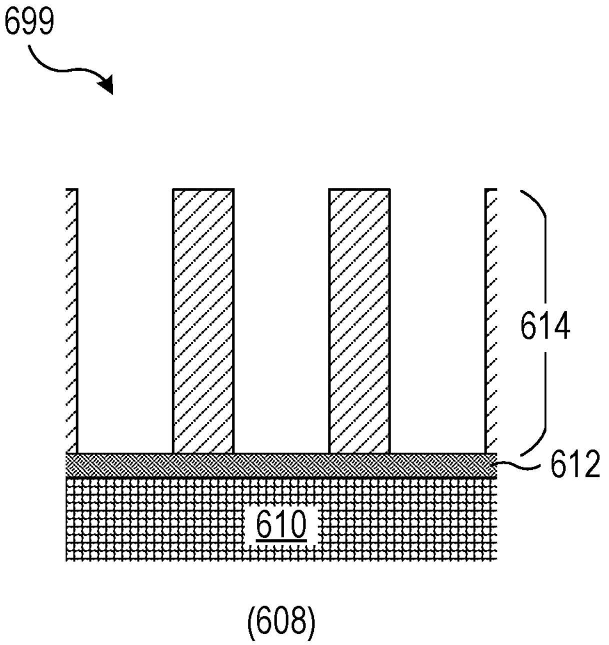
FIGS. 6A-6B illustrate a conventional wet liner removal process.

As the name suggests, the features of the patterned layer are often formed in a separate process than any patterning/removal of the liner. In a subsequent step, the liner may be etched (i.e., removed) from between the features of the patterned layer. One conventional method removing the liner is using a wet etching process. For example, referring now to FIG. 6A, at an initial state 608 of a conventional wet removal process 699, a substrate 610 includes a liner 612 disposed over the substrate 610 and a patterned layer 614 overlying the liner 612.

At this stage, such as when electrical contact between the individual features of the patterned layer 614 and devices in the substrate 610 is the goal, the liner 612 may need to be removed from between the features without negatively impacting the patterned layer 614 or the substrate 610. Further, a sufficient amount of the liner 612 may also need to remain between the patterned layer 614 and the substrate 610 (e.g., to ensure that the function the liner 612 is achieved).

Figure 6B:
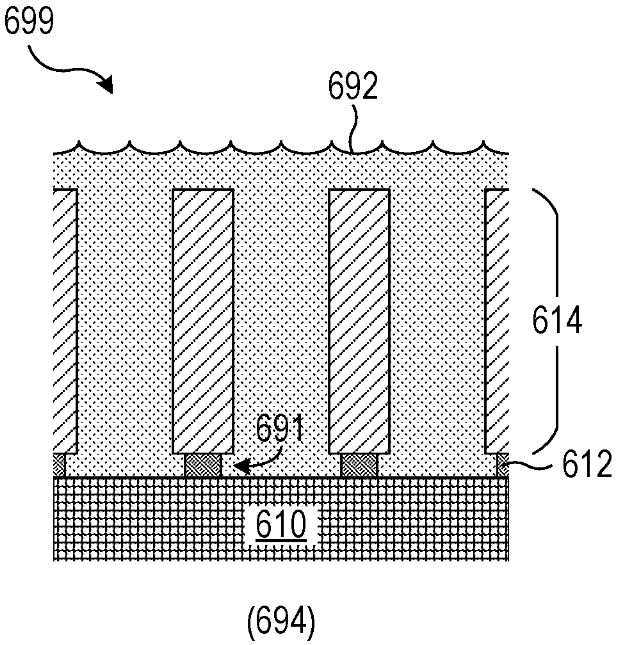
FIG. 6B Prior Art

Referring now to FIG. 6B, in the conventional wet removal process 699, a wet etchant 692 is used in a conventional wet liner etch 694 to etch away the liner 612 from between the features of the patterned layer 614. However, as shown, the conventional wet liner etch 694 results in undesirable liner undercutting 691 as the isotropic nature of the wet etching process etches underneath the features of the liner 612. This may be particularly undesirable when the remaining liner 612 is designed to form electrical contacts for interconnects of the patterned layer 614, as the resistance of the contact is increased and overall device performance is negatively impacted.

Figure 7A:
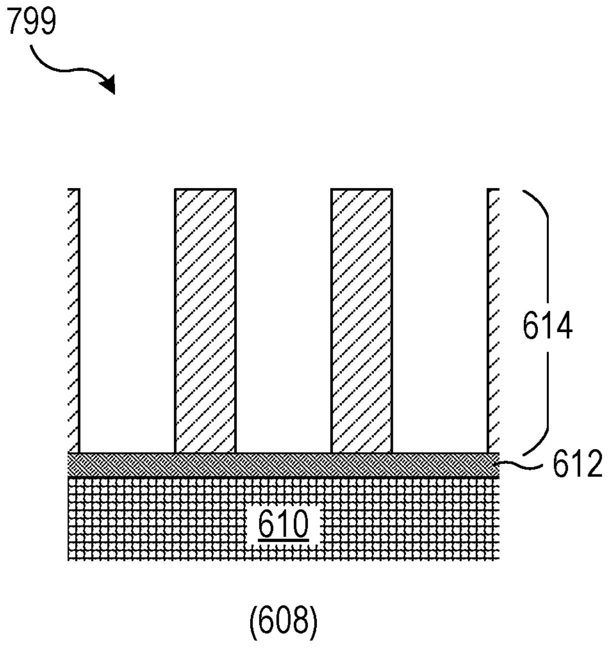
FIGS. 7A-7B illustrate a conventional dry liner removal process.
Figure 7B:
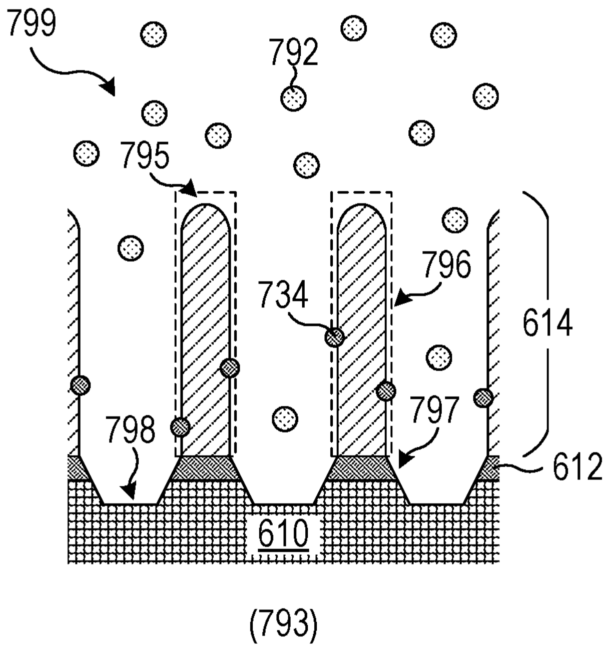
FIG. 7B Prior Art

Another conventional method removing the liner is using a dry etching process. As shown in FIGS. 7A and 7B, in a conventional dry liner etch 793 of a conventional dry removal process 799, a dry etchant 792 is used to etch the liner 612 from between the features of the patterned layer 614. Compared to the conventional wet liner etch 694, the conventional dry liner etch 793 is substantially anisotropic and no undercutting results. Instead, a footing 797 is formed at the base of the features. While undercutting is avoided, a variety of other undesirable aspects of the conventional dry liner etch 793 are apparent (including, in some cases the shape and extent of the footing 797).

The conventional dry liner etch 793 is not as selective as the conventional wet liner etch 694. Consequently, material of both the patterned layer 614 and the substrate 610 is also removed during the conventional dry liner etch 793. For the patterned layer 614, this manifests as rounding 795 and sidewall etching 796. For the substrate 610, substrate gouging 798 occurs (which can be very detrimental given the substrate 610 often includes delicate devices near the surface).

Another drawback of the conventional dry liner etch 793 relates to the propensity of dry etching process to produce etching byproducts that reattach to other surfaces before they are successfully removed from the system. This is illustrated in FIG. 7B as liner residue 734 that contaminates the features of the patterned layer 614. In the specific example of interconnects, the contamination may cause electrical shorts between traces or detrimentally alter the electrical properties (e.g., conductivity) of the interconnects thereby decreasing overall device performance.

In accordance with embodiments herein described, the invention proposes a method of removing a liner from between features of a patterned layer using a conformal protection layer that protects the patterned layer from residue during a dry etching process of the liner. The conformal protection layer is then removed using a wet etching process with little or no negative impact to the patterned layer, the substrate, or the remaining liner forming the interface between features of the patterned layer and the substrate.

In various embodiments, a method includes etching a liner (e.g., formed from a ceramic material, such as titanium nitride (TiN), tantalum nitride (TaN), etc.) formed between a patterned layer (e.g., an interconnect layer, such as a ruthenium interconnect layer) and a substrate includes forming a conformal protection layer over the patterned layer and the liner, dry etching the liner to expose the substrate using the patterned layer as an etch mask, and performing a wet etch that removes the conformal protection layer.

In some implementations, the patterned layer includes a hardmask (e.g., that was used as an etch mask to form the patterned layer). The hardmask may protect the underlying portions of the patterned layer (e.g., interconnects) from damage during the dry etch of the liner. Optionally, a mask protection structure may also be formed before the dry etch of the liner to further protect the patterned layer. The mask protection structure may be formed before or after the conformal protection layer. When present, the wet etch of the conformal layer may also remove any remaining portions of the hardmask and the mask protection structure (as well as other undesirable materials). For example, the wet etch may be a cleaning step of the patterned layer, leaving only the patterned layer, the substrate exposed between features of the patterned layer, and the liner portions intentionally spared during the dry etch.

The embodiment etching processes described herein may have various advantages over conventional etching processes. For example, the embodiment etching processes may advantageously avoid drawbacks associated with both conventional dry liner removal processes and conventional wet removal processes, such as liner undercutting, substrate gouging, and damage to the overlying patterned layer, including rounding, sidewall etching, and liner residue. As a result, overall device performance and reliability may be improved as the profile of the liner and the patterned layers is maintained while also avoiding undesirable byproduct contamination. For the patterned layer (e.g., a layer including interconnects, such as ruthenium interconnects) little or no material is lost and the profile is desirably straighter. This also applies to the liner, which also advantageously has a straighter profile (compared to the undercut or footing profiles of conventional methods, for example). Additionally, the embodiment etching processes may have the advantage of being performed in situ in an etching chamber (such as a plasma etching chamber, for example).

Embodiments provided below describe various etching processes, and in particular embodiments, systems and methods for etching a liner formed between a patterned layer and a substrate using a conformal protection layer. The following description describes the embodiments. FIGS. 1A-1D are used to describe an example etching process. Two more example etching processes are described using FIGS. 2A-2F and FIGS. 3A-3D. An example etching system that can be used to perform the etching processes is described using FIG. 4 while FIG. 5 is used to describe an example method of etching a liner formed between a patterned layer and a substrate.

Figure 1A:
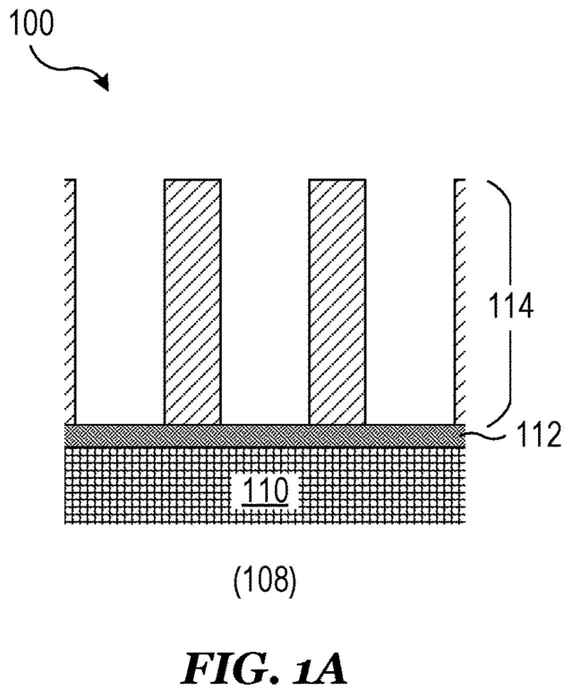
FIGS. 1A-1D illustrate an example etching process that includes a conformal deposition, a dry etch, and a wet etch where
Figure 1B:
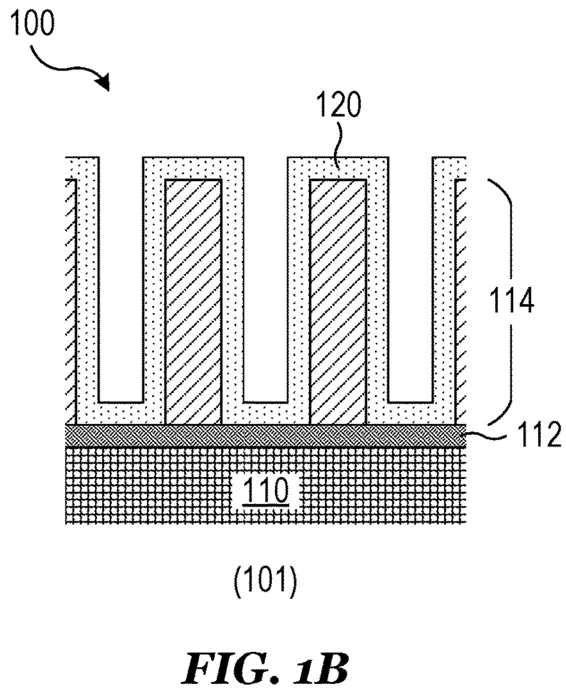
Figure 1C:
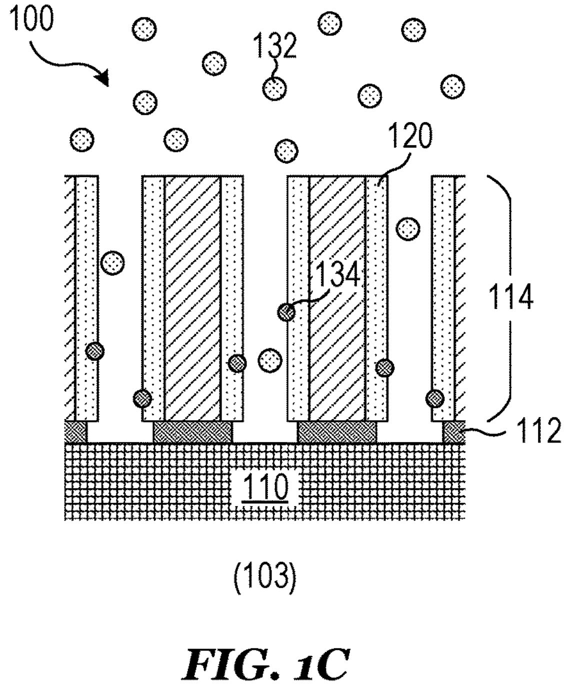
Figure 1D:
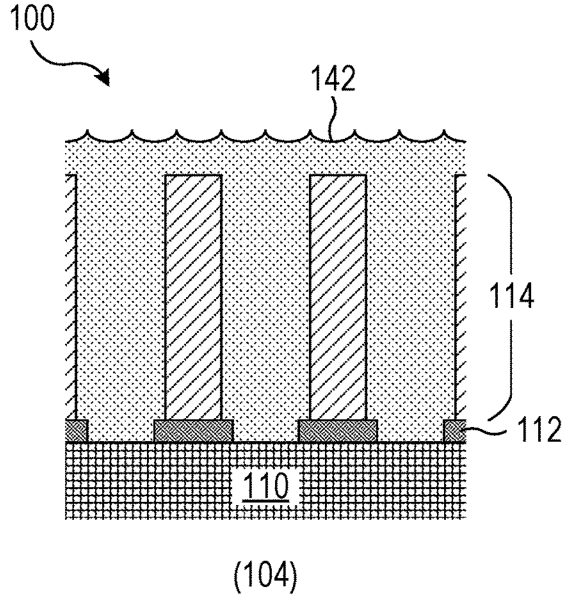

FIGS. 1A-1D illustrate an example etching process that includes a conformal deposition, a dry etch, and a wet etch where FIG. 1A shows an initial state of a patterned layer overlying a liner, FIG. 1B shows the conformal deposition of a protection layer over the patterned layer, FIG. 1C shows the dry etch of the liner, and FIG. 1D shows the wet etch that removes the protection layer in accordance with embodiments of the invention.

Referring to FIG. 1A, an initial state 108 of an etching process 100 includes a substrate 110 with a liner 112 disposed thereon and a patterned layer 114 overlying the liner 112. The substrate 110 may include various layers ranging from amorphous silicon (aSi) to organic layers (e.g., an OPL) to oxides (e.g., silicon oxide ($SiO_2$) such as LTO, tetraethyl orthosilicate (TEOS), aluminum oxide ($Al_2O_3$), etc.) to nitrides (e.g., silicon nitride ($Si_3N_4$)) and metals. Moreover, the substrate 110 may be any suitable substrate, such as an insulating, conducting, or semiconducting substrate with one or more layers disposed thereon. For example, the substrate 110 may be a semiconductor wafer, such as a silicon wafer, and include various layers, structures, and devices (e.g., forming integrated circuits). In one embodiment, the substrate 110 includes silicon. In another embodiment, the substrate 110 includes silicon germanium (SiGe). In still another embodiment, the substrate 110 includes gallium arsenide (GaAs). Of course, many other suitable materials, semiconductor or otherwise, may be included in the substrate 110 as may be apparent to those of skill in the art.

Similarly, the patterned layer 114 may also include many layers and is not restricted to any specific material or structure. In various embodiments, the patterned layer 114 includes a conductive material and includes a patterned interconnect layer in some embodiments. For example, the interconnects may be formed from or include electrically conductive materials such as copper, silver, gold, platinum, palladium, ruthenium, molybdenum, tungsten, etc. In one embodiment, the patterned layer 114 includes interconnects formed from ruthenium. However, other configurations are possible such as interconnects formed from tungsten, interconnects formed from silver, interconnects formed from molybdenum, and so on.

The liner 112 in the initial state 108 is substantially unpatterned, existing as a layer between the substrate 110 and the patterned layer 114. In various embodiments, the liner 112 is configured to act as an adhesion layer, barrier layer, contact layer, etc. The liner 112 may be electrically conductive (e.g., when forming the interface between interconnects of the patterned layer 114 and devices of the substrate 110). In various embodiments, the liner 112 is a ceramic liner, and is a ceramic nitride liner in some embodiments. In one embodiment, the liner 112 is a TaN liner. In another embodiment, the liner 112 is a TiN liner. Other ceramic nitride liners are also possible, such as tungsten nitride (WN). The liner 112 may be thin relative to surrounding layers, such as between about 1 nm and about 3 nm (compared to the interconnects which may be between about 50 nm and about 100 nm, as but one example).

A hardmask (e.g., used as an etch mask during formation of the patterned layer 114) may also be included in the patterned layer 114. For example, the hardmask may include one or more layers of materials, such as oxides, nitrides, etc. that are suitable for use as an etch mask for a target layer (e.g., an unpatterned interconnect material, such as a ruthenium layer). When included the hardmask may have any thickness, but one example is between about 10 nm and about 20 nm.

Referring now to FIG. 1B, the etching process 100 includes a conformal deposition 101 during which a conformal protection layer 120 is formed over the patterned layer 114 (and the exposed portions of the liner 112) as shown. The conformal protection layer 120 is configured to conform closely to the structure of the patterned layer 114 and the liner 112 (e.g., to avoid clogging of features of the patterned layer 114. The conformal deposition 101 may be performed using any suitable conformal deposition process. In various embodiments, the conformal deposition 101 is an atomic layer deposition (ALD) process, and is a plasma-assisted ALD (PA-ALD) process in one embodiment. Other conformal deposition methodologies may also be used, such as molecular layer deposition (MLD), among others.

Turning now to FIG. 1C, the liner 112 is etched using a dry etchant 132 during a dry liner etch 103. Notably, although liner residue 134 is generated during the dry liner etch 103, the conformal protection layer 120 is configured to protect the patterned layer 114 from the liner residue 134. Additionally, the dry etchant 132 and the processing conditions of the dry liner etch 103 are configured to (e.g., selected to, designed, to, etc.) avoid damage to the patterned layer 114. Some of the conformal protection layer 120 is etched during the dry liner etch 103, which allows the liner 112 to be etched.

As shown in FIG. 1D, the conformal protection layer 120 is then removed from the patterned layer 114 and the liner 112 using a wet etchant 142 during a wet etch 104 leaving the patterned layer 114, the liner 112, and the substrate 110 with the desired profiles. Specifically, although some slight undercut may occur during the dry liner etch 103 (e.g., slight relative to severe undercut that occurs during many wet etching processes), any undercut of the liner is an undercut of the conformal protection layer 120 and results in the profile of the remaining liner 112 being wider than the profile of the patterned layer 114. As previously discussed, this may be desirable, for example when device performance is negatively impacted by reduced electrical conductivity between the patterned layer 114 and the substrate 110.

The material composition of the conformal protection layer 120 may be chosen based on compatibility with the dry liner etch 103 and the wet etch 104 to achieve the desired result. For example, the conformal protection layer 120 may be configured to be fully removed by the wet etchant 142 during the wet etch 104 and to be anisotropically etched by the dry etchant 132 while remaining on sidewalls of the patterned layer 114 during the dry liner etch 103. In various embodiments, the conformal protection layer 120 is an oxide material, and is silicon dioxide ($SiO_2$) in one embodiment.

Figure 2A:
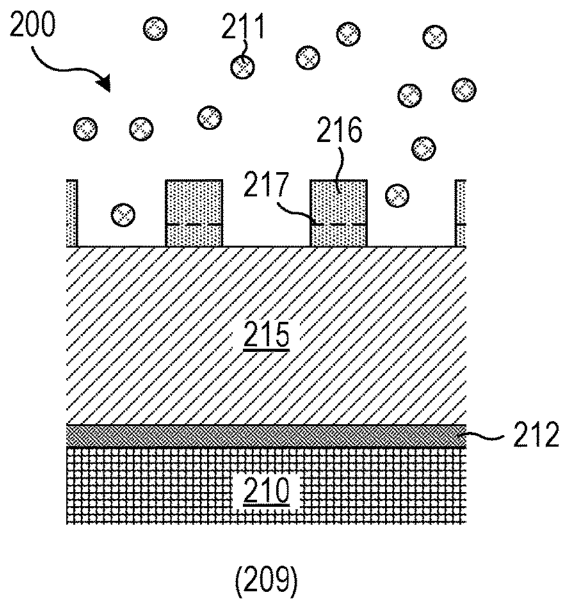
FIGS. 2A-2F illustrate an example etching process that includes a conformal deposition, mask growth, a dry etch, and a wet etch where
Figure 2B:
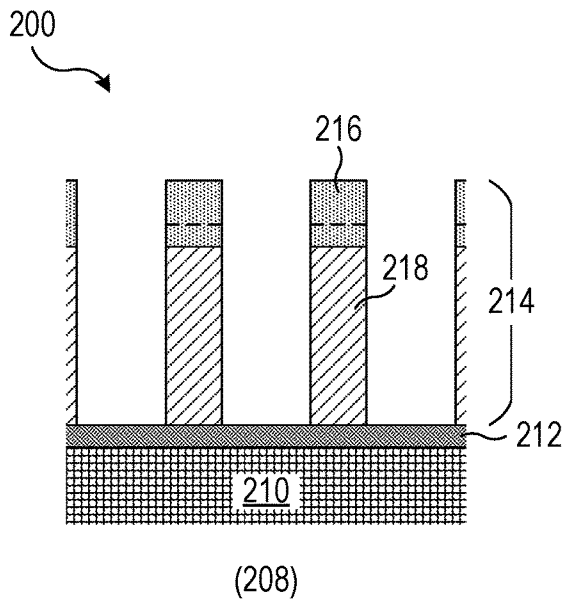
Figure 2C:
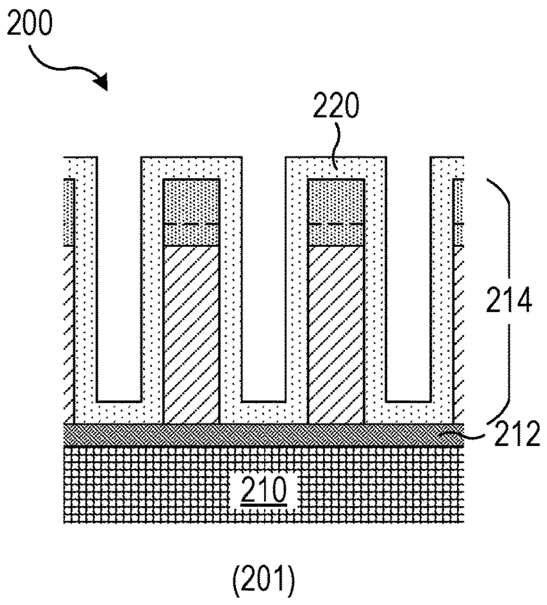
Figure 2D:
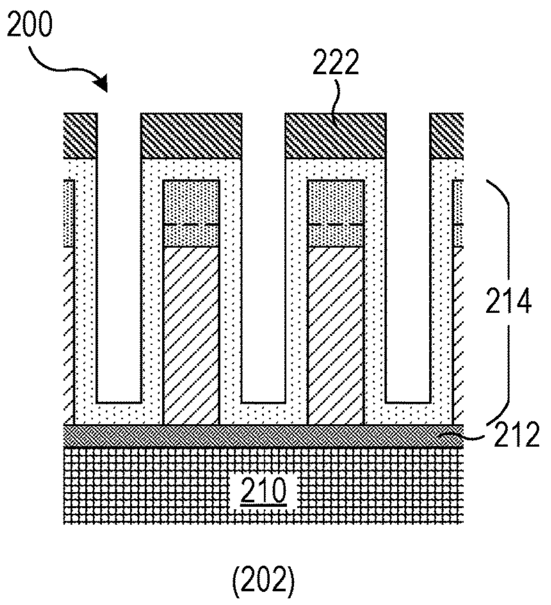
Figure 2E:
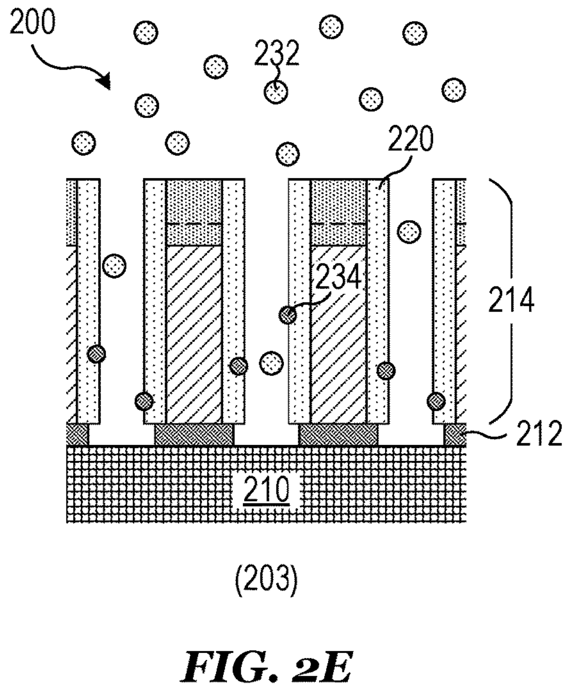
Figure 2F:
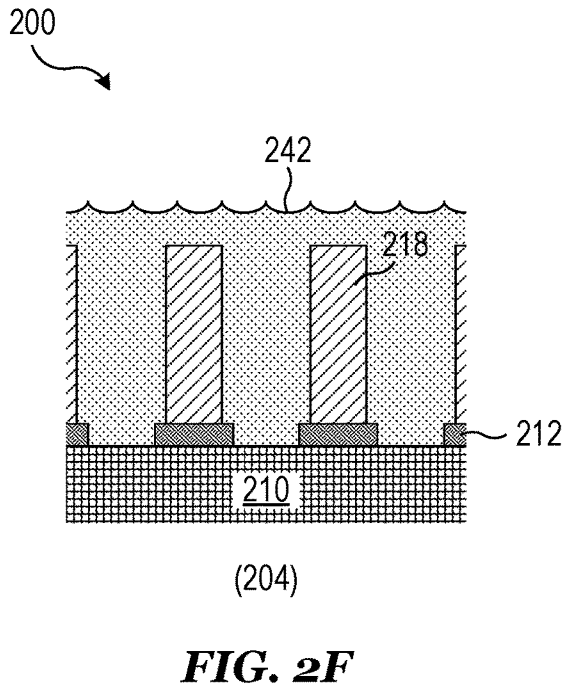

FIGS. 2A-2F illustrate an example etching process that includes a conformal deposition, mask growth, a dry etch, and a wet etch where FIG. 2A shows a preliminary etch of a target layer to form a patterned layer, FIG. 2B shows an initial state of the patterned layer overlying a liner, FIG. 2C shows the conformal deposition of a protection layer over the patterned layer, FIG. 2D shows the mask growth of a protection structure over the patterned layer, FIG. 2E shows the dry etch of the liner, and FIG. 2F shows the wet etch that removes the protection layer in accordance with embodiments of the invention. The etching process of FIGS. 2A-2F may be a specific implementation of other etching processes described herein such as the etching process of FIGS. 1A-1D, for example. Similarly labeled elements may be as previously described.

Referring to FIG. 2A, an etching process 200 may include a preliminary etch 209 of a target layer 215 formed on a liner 212 overlying a substrate 210. It should be noted that here and in the following a convention has been adopted for brevity and clarity wherein elements adhering to the pattern [x12] where 'x' is the figure number may be related implementations of a liner in various embodiments. For example, the liner 212 may be similar to the liner 112 except as otherwise stated. An analogous convention has also been adopted for other elements as made clear by the use of similar terms in conjunction with the aforementioned numbering system.

The preliminary etch 209 of the target layer 215 may form a patterned layer 214 that includes a hardmask 216 and a patterned interconnect layer 218. For example, the hardmask 216 may be used as an etch mask during the preliminary etch 209 to protect regions of the target layer 215 from a preliminary etchant 211. The hardmask 216 may be any suitable material and may be a multilayer 217 hardmask in various embodiments. For example, the hardmask 216 may include an oxide material, such as $SiO_2$, titanium oxide ($TiO_2$), etc., a nitride material, such as silicon nitride ($Si_3N_4$), TiN, silicon carbonitride (SiCN), etc., and other materials.

The preliminary etch 209 may be a plasma etch and the preliminary etchant 211 may include a halogen species. For example, the preliminary etchant 211 may include chlorine ($Cl_2$) in some embodiments, and oxygen ($O_2$) is added to the chlorine in one embodiment. Other halogens may also be used, such as fluorine, for example. One example of a target layer 215 that may be etched using a halogen etchant with or without adding oxygen is ruthenium. Of course, other etchants may also be possible, the specific etchant composition depending on the details of a given application.

Now referring to FIGS. 2B-2E the patterned layer 214, the liner 212, and the substrate 210 are in an initial state 208 after the preliminary etch 209 and a conformal protection layer 220 is formed over the patterned layer 214 (including the hardmask 216 and the patterned interconnect layer 218) in a conformal deposition 201. As shown in FIG. 2D, the etching process 200 may also include a mask growth 202 during which a mask protection structure 222 may be formed on upper surfaces of features of the patterned layer 214 (such as upper surfaces of an existing hardmask 216 that have been covered by the conformal protection layer 220).

The liner 212 is then etched with a dry etchant 232 using the mask protection structure 222 as an etch mask in a dry liner etch 203 and with the conformal protection layer 220 protecting the patterned interconnect layer 218 from liner residue 234. As examples (e.g., when the liner 212 is TaN or TiN), the dry etchant 232 may include boron and a halogen, such as chlorine or may include a fluorocarbon (CF). In one embodiment, the dry liner etch 203 uses a $BCl_3/Cl_2$ plasma. In another embodiment, the dry liner etch 203 uses a CF-based plasma. As shown in FIG. 2E, the mask protection structure 222 may be a sacrificial structure consumed by the dry liner etch 203 (and the hardmask 216 may then serve as an etch mask for some of the dry liner etch 203).

The material of the mask protection structure 222 may be any suitable material configured to provide desired additional protection during the dry liner etch 203. In some cases, this may allow higher power (e.g., radio frequency (RF) source power for a plasma etching process) to be used, which may have the advantage of straighter etch profile of the patterned interconnect layer 218 (e.g., decreasing lateral etch, minimizing substrate gouging, etc.). In various embodiments, the mask protection structure 222 is a silicon-containing mask protection structure and is formed from silicon tetrachloride ($SiCl_4$) in one embodiment. The mask growth 202 may be performed before or after the conformal deposition 201 and may be combined with other processing steps, such as a hydrogen treatment of upper surfaces of the hardmask 216, which may aid in achieving the desired growth of the mask protection structure 222 at the upper surfaces.

Turning now to FIG. 2F, the conformal protection layer 220, any remaining portions of the hardmask 216 (when included), and any remaining portions of the mask protection structure 222 are removed during a wet etch 204 using a wet etchant 242. This results in the patterned interconnect layer 218, the liner 212, and the substrate 210 being left behind with the desired profile and without undesirable contamination. In some implementations, including oxygen in the hardmask 216 may be advantageous for complete removal of the hardmask 216 during the wet etch 204, which may be a cleaning step (e.g., using HF, for example).

Figure 3A:
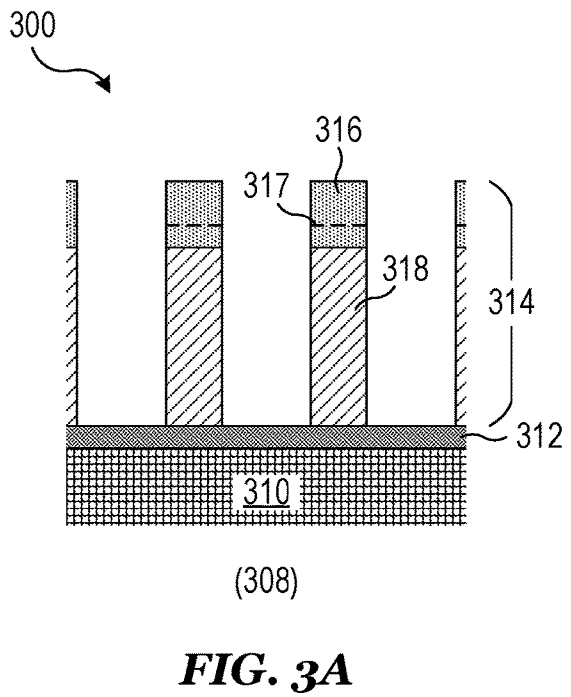
FIGS. 3A-3D illustrate an example etching process that includes mask growth and then a conformal deposition, followed by a dry etch where
Figure 3B:
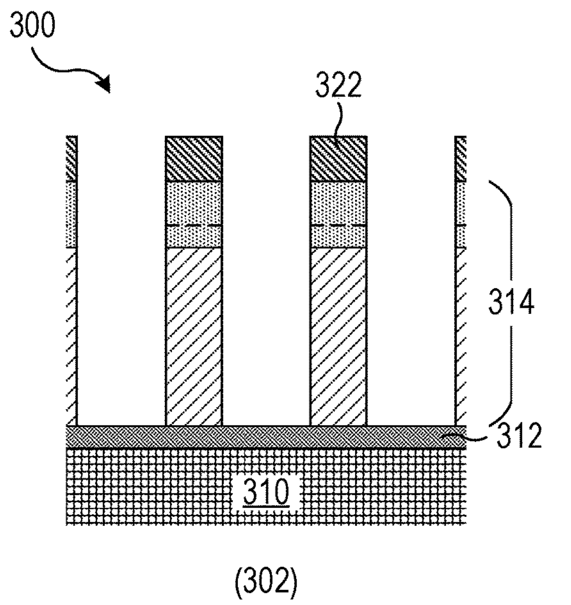
Figure 3C:
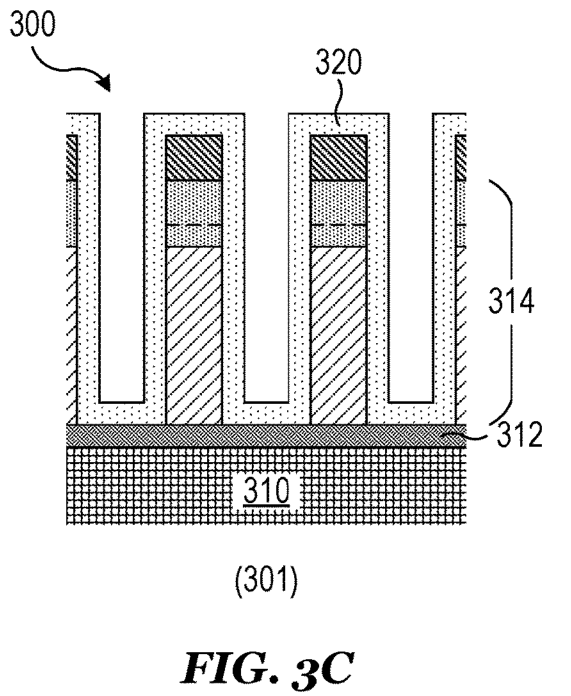
Figure 3D:
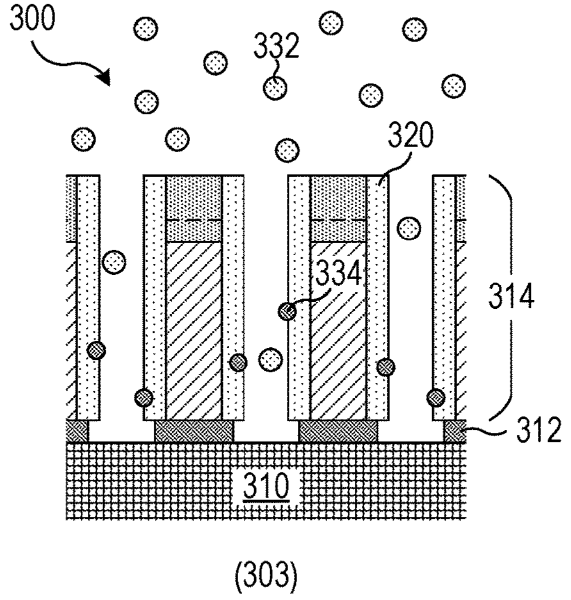

FIGS. 3A-3D illustrate an example etching process that includes mask growth and then a conformal deposition, followed by a dry etch where FIG. 3A shows an initial state of a patterned layer overlying a liner, FIG. 3B shows the mask growth of a protection structure over the patterned layer, FIG. 3C shows the conformal deposition of a protection layer over the protection structure and the patterned layer, and FIG. 3D shows the dry etch of the liner in accordance with embodiments of the invention. The etching process of FIGS. 3A-3D may be a specific implementation of other etching processes described herein such as the etching process of FIGS. 1A-ID, for example. Similarly labeled elements may be as previously described.

Referring to FIGS. 3A-3D, an etching process 300 begins with a substrate 310 in an initial state 308 (i.e., with a liner 312 disposed thereon and a patterned layer 314 overlying the liner 312). The patterned layer 314 may include a hardmask 316 (which may be a multilayer 317 hardmask) disposed on a patterned interconnect layer 318, as shown. In contrast to the etching process 200 of FIGS. 2A-2F, a mask protection structure 322 may be formed on upper surfaces of the patterned layer 314 during a mask growth 302 before a conformal protection layer 320 is formed over the mask protection structure 322 and the patterned layer 314 in a conformal deposition 301. The liner 312 may then be etched using a dry etchant 332 during a dry liner etch 303 using the mask protection structure 322 (which may or may not be completely consumed) and hardmask 316 as etch masks while the conformal protection layer 320 protects the patterned interconnect layer 318 from liner residue 334. As before, at this stage, the conformal protection layer 320 as well as any remaining portions of the mask protection structure 322 and the hardmask 216 (and any other desired materials or structures structures) can then be removed using a wet etch similar to the wet etch 204 shown in FIG. 2F, for example, leaving the patterned interconnect layer 318, the liner 312 and the substrate 310 with the desired profile and free of undesirable contamination.

Figure 4:
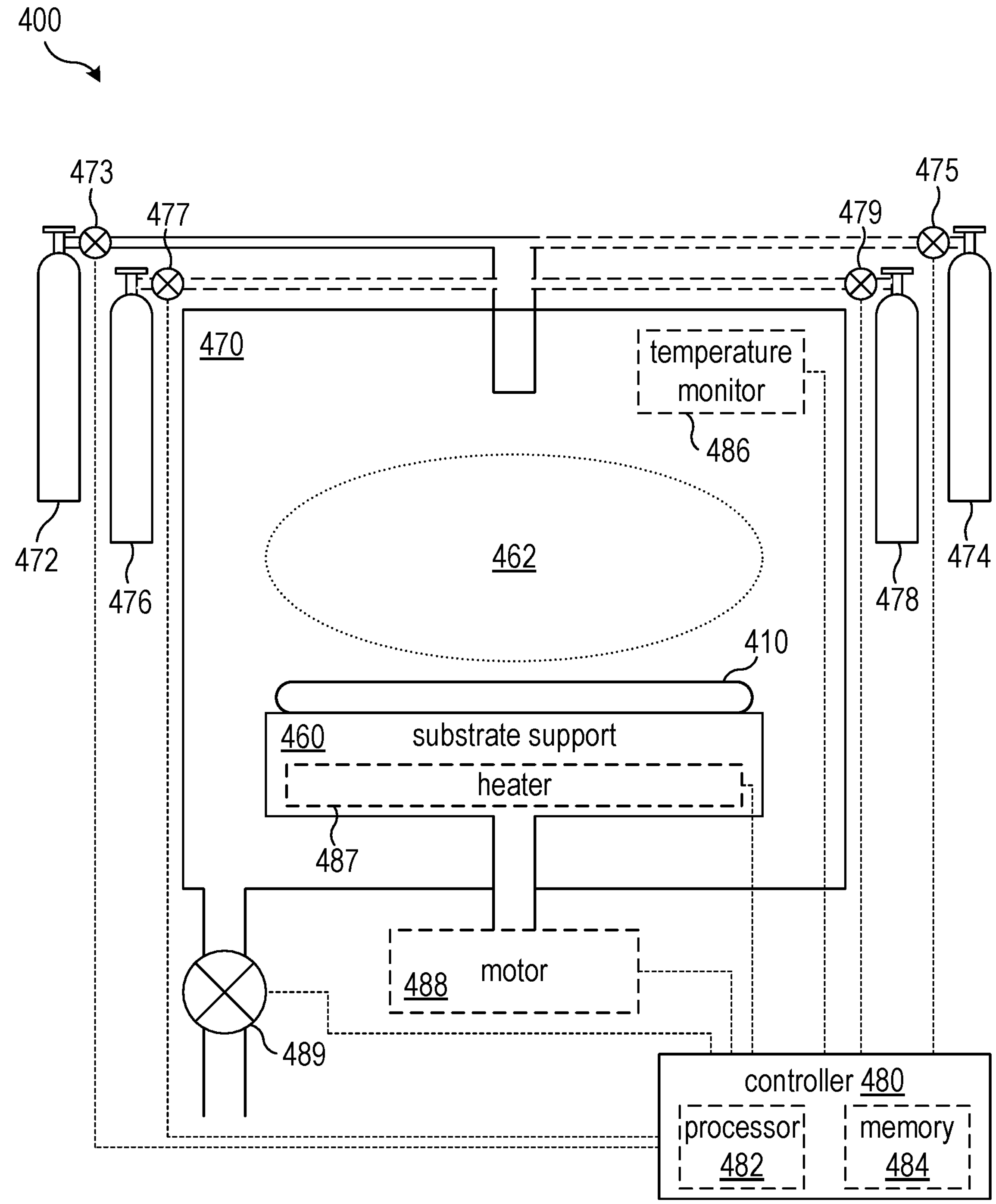
FIG. 4 illustrates an example etching system in accordance with embodiments of the invention.
Figure 5:
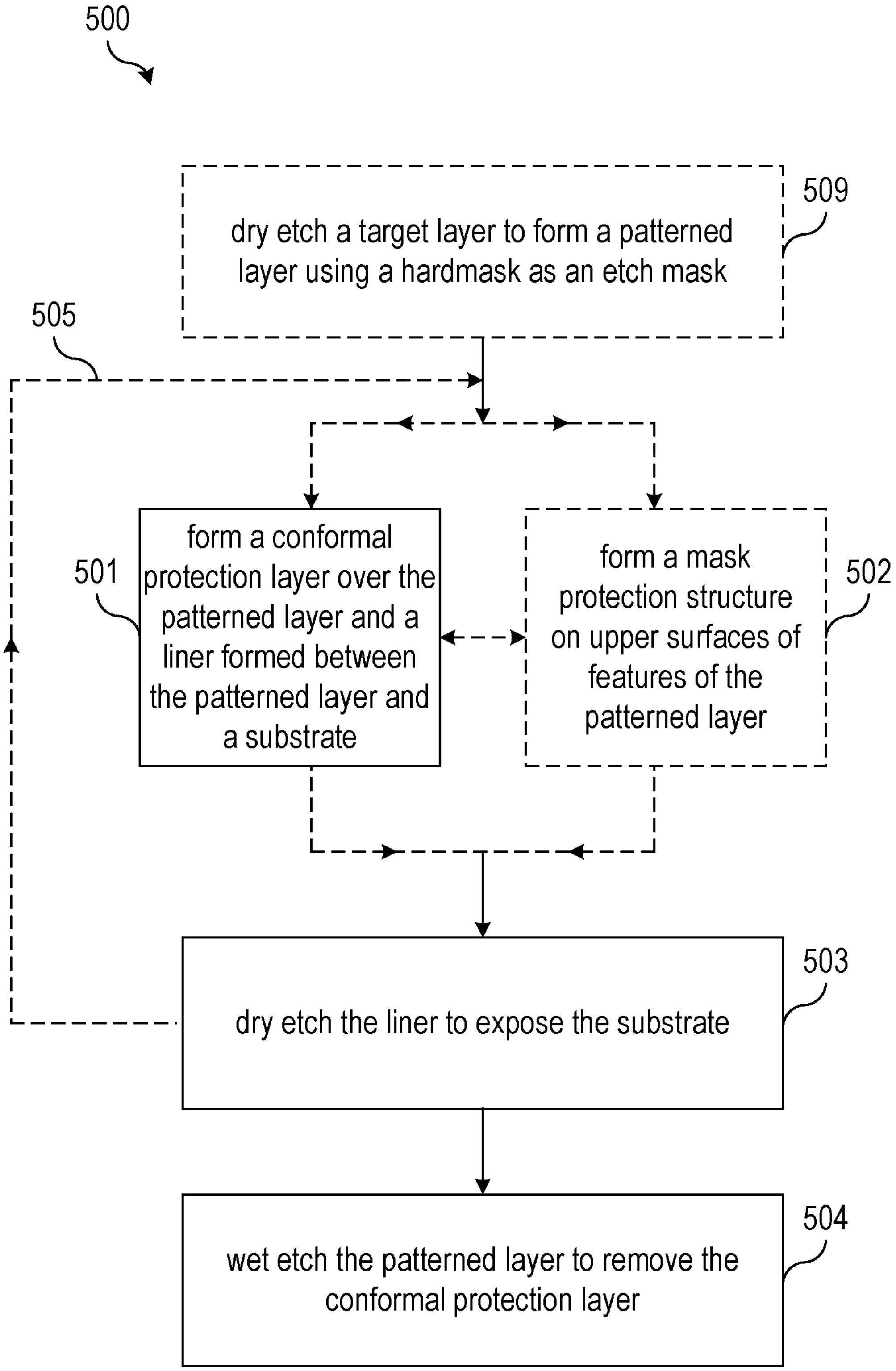
FIG. 5 illustrates an example method of etching a liner formed between a patterned layer and a substrate in accordance with embodiments of the invention.

FIG. 4 illustrates an example etching system in accordance with embodiments of the invention. The etching system of FIG. 4 may be used to perform any of the etching processes described herein, such as the etching process of FIGS. 1A-1D, for example. Similarly labeled elements may be as previously described.

Referring to FIG. 4, an etching system 400 (e.g., a plasma deposition system, and may also be an etching system, such as a plasma etching system like an RIE etching system) includes a substrate support 460 configured to support a substrate 410 that is disposed within an etching chamber 470, such as a plasma etching chamber. A conformal source 472 configured to supply one or more gases for the conformal deposition of a protection layer over a patterned layer and an underlying liner is fluidically coupled to the etching chamber 470 through a conformal valve 473. An optional mask growth source 474 configured to supply one or more gases for mask growth of a protection structure on features of the patterned layer may be fluidically coupled to the etching chamber 470 through an optional mask growth valve 475.

Additional gas sources and valves may also be included in the etching system 400. For example, an optional additional gas source 476 may be fluidically coupled to the etching chamber 470 through an optional additional gas valve 477 (an additional gas may be any type of gas, such as a carrier gas, and multiple additional gases may be included) while an optional etch gas source 478 may be fluidically coupled to the etching chamber 470 through an optional etch gas valve 479 (e.g., for when etching processes are performed in situ with the conformal deposition and the mask growth (when included), such as etching of a target layer to form the patterned layer, dry etching of the liner, etc.). An exhaust valve 489 is included to evacuate the etching chamber 470 (and or the etching chamber 470) during the plasma process.

The etching system 400 may be configured to generate an optional plasma 462 during any or all of the steps of an etching process (e.g., during a preliminary etch step, conformal deposition step, a mask growth step, a dry liner etch step, etc.). The etching chamber 470 may be any suitable etching chamber (e.g., an RIE chamber, a capacitively couple plasma (CCP) etching chamber, an inductively coupled plasma (ICP) etching chamber) and may also be configured to function as a deposition chamber (e.g., a CVD chamber, ALD chamber, MLD, chamber, and others).

An optional temperature monitor 486 may be included to monitor and/or aid in controlling the temperature of the substrate 410 and the environment in the etching chamber 470. An optional heater 487 may be included to elevate the temperature of the substrate 410 above the equilibrium temperature at the substrate 410 during the deposition process. Alternatively, the optional heater 487 may optionally be a cooler to decrease the temperature of the substrate 410 below equilibrium. An optional motor 488 may also be included to improve process uniformity.

A controller 480 is operationally coupled to the valves (the conformal valve 473, the optional mask growth valve 475, the optional additional gas valve 477, the optional etch gas valve 479, etc.), and may be operationally coupled to any of the optional temperature monitor 486, the optional heater 487, the optional motor 488, and the exhaust valve 489. The controller 480 may include a processor 482 and a memory 484 (i.e., a non-transitory computer-readable medium) that stores a program including instructions that, when executed by the processor 482, perform a selective deposition process. For example, the memory 484 may have volatile memory (e.g., random access memory (RAM)) and non-volatile memory (e.g., flash memory). Alternatively, the program may be stored in physical memory at a remote location, such as in cloud storage. The processor 482 may be any suitable processor, such as the processor of a microcontroller, a general-purpose processor (such as a central processing unit (CPU), a microprocessor, a field-programmable gate array (FPGA), an application-specific integrated circuit (ASIC), and others.

FIG. 5 illustrates an example method of etching a liner formed between a patterned layer and a substrate in accordance with embodiments of the invention. The method of FIG. 5 may be combined with other methods and performed using the systems and apparatuses as described herein. For example, the method of FIG. 5 may be combined with any of the embodiments of FIGS. 1A-4. Although shown in a logical order, the arrangement and numbering of the steps of FIG. 5 are not intended to be limited. The method steps of FIG. 5 may be performed in any suitable order or concurrently with one another as may be apparent to a person of skill in the art.

Referring to FIG. 5, a method 500 of etching a liner (e.g., an electrically conductive liner formed of a ceramic material, such as a TiN liner, a TaN, liner, etc.) formed between a patterned layer (e.g., a layer including interconnects formed from an electrically conductive material like ruthenium, such as a patterned interconnect layer) and a substrate (such as a silicon-containing substrate like a bulk silicon substrate) includes a conformal deposition step 501 of forming a conformal protection layer over the patterned layer and the liner. For example, the conformal protection layer may be formed using an ALD process. The liner is then dry etched in a dry liner etch step 503 to expose the substrate (i.e., the substrate underlying the regions between features of the patterned layer). The patterned layer (or a portion of the patterned layer, such as a hardmask) is used as an etch mask during the dry etch of the liner. The dry etch may utilize plasma, such as plasma including boron and chorine, plasma including a fluorocarbon, and others. A wet etch is then performed in a wet etch step 504 to remove the conformal protection layer.

Optionally, a mask protection structure may be formed in a mask growth step 502 before the dry liner etch step 503. The mask protection structure is formed on features of the conformal protection layer (e.g., on upper surfaces using a selective formation process, such as a growth process seeded by material at the upper surfaces or a deposition process that results in the mask protection structure being formed on the upper surfaces to the substantial exclusion of other surfaces, such as sidewalls, bottom surfaces of features, etc.). The conformal deposition step 501 and the mask growth step 502 may be performed in either order (as discussed in more detail in the foregoing). During the dry liner etch step 503, the mask protection structure may be used as an etch mask (e.g., along with or instead of a hardmask). In some implementations, the mask protection structure is a sacrificial that is consumed during the dry liner etch step 503.

A preliminary etch step 509 may be included to prepare the patterned layer on the liner. For example, the preliminary etch step 509 may include dry etching a target layer (e.g., a ruthenium layer) to form the patterned layer using a hardmask as an etch mask. Some portion of the hardmask may then persist as a part of the patterned layer (and may be used as an etch mask during the dry liner etch step 503, for example). The preliminary etch step 509 is selective to the target layer and does not etch the liner (if it did it would be similar to the conventional dry liner etch resulting in undesirable profile and contamination). The dry etchant in the preliminary etch step 509 may include a halogen, such as chlorine, fluorine, etc. In some implementations, oxygen may also be added (e.g., to improve the etch rate).

The wet etch may be configured to clean the patterned layer using wet etchant (e.g., including hydrofluoric acid (HF)). In addition to cleaning the conformal protection layer from the pattern layer, the remaining liner, and the substrate, the wet etch may then also clean other materials, when included. For example, remaining material from a hardmask and/or a mask protection structure may sometimes persist after the dry liner etch step 503. The wet etch of the wet etch step 504 may also remove these remaining portions of the hardmask and the mask protection structure.

The conformal deposition step 501, the mask growth step 502 (when included), and the dry liner etch step 503 may be repeated as part of a cycle 505 as many times as necessary to etch the liner a desired amount. For example, in some cases, the liner may not be fully etched after a single pass of the conformal deposition step 501 and the dry liner etch step 503. Further etching might damage the patterned layer and/or the substrate (e.g., resulting in problems akin to conventional methods). Advantageously, the conformal deposition step 501, the mask growth step 502 (when included), and the dry liner etch step 503 can be repeated (as many times as desired) until the liner is fully etched while still maintaining the desired structural profiles and avoiding contamination.

Additionally, some or all of the method 500 may be performed in situ in the same etching chamber. In various embodiments, the conformal deposition step 501 and the dry liner etch step 503 may be performed in situ in the same etching chamber. When cycled, the cycle 505 may be repeated in situ as well. Further, the preliminary etch step 509 may be performed in situ in the etching chamber, followed by the conformal deposition step 501 and the dry liner etch step 503, cycled as necessary (also in situ). Of course, when included any of the preceding examples may also include the mask growth step 502 performed in situ.

Example embodiments of the invention are summarized here. Other embodiments can also be understood from the entirety of the specification as well as the claims filed herein.

Example 1. A method of etching a liner formed between a patterned layer and a substrate, the method including: forming a conformal protection layer over the patterned layer and the liner; dry etching the liner to expose the substrate using the patterned layer as an etch mask; and wet etching and removing the conformal protection layer.

Example 2. The method of example 1, further including: forming a mask protection structure over the patterned layer and the liner to extend features of the patterned layer before dry etching the liner, where dry etching the liner includes using the mask protection structure at least part of the etch mask, and where wet etching the patterned layer also removes any remaining portions of the mask protection structure.

Example 3. The method of example 2, where the patterned layer includes a hardmask overlying a patterned ruthenium interconnect layer, where the liner is a ceramic liner configured to electrically couple the patterned ruthenium interconnect layer with the substrate, where dry etching the liner further includes using the hardmask as at least part of the etch mask, and where wet etching the patterned layer also removes any remaining portions of the hardmask.

Example 4. The method of one of examples 1 to 3, where forming the conformal protection layer and dry etching the liner are performed in situ in an etching chamber.

Example 5. The method of one of examples 1 to 4, where wet etching the patterned layer includes cleaning the patterned layer using a wet etchant including hydrofluoric acid (HF).

Example 6. The method of one of examples 1 to 5, further including: repeating the steps of forming the conformal protection layer and dry etching the liner as a cycle before wet etching the patterned layer.

Example 7. A method of etching a liner formed between a patterned layer and a substrate, the method including: forming a conformal protection layer over the patterned layer and the liner; forming a mask protection structure on upper surfaces of features of the patterned layer; dry etching the liner to expose the substrate using the mask protection structure as an etch mask; and wet etching and removing the conformal protection layer.

Example 8. The method of example 7, where forming the conformal protection layer is performed before forming the mask protection structure.

Example 9. The method of example 7, where forming the mask protection structure is performed before forming the conformal protection layer.

Example 10. The method of one of examples 7 to 9, where the patterned layer is a patterned ruthenium interconnect layer.

Example 11. The method of one of examples 7 to 10, where forming the conformal protection layer, forming the mask protection structure, and dry etching the liner are performed in situ in an etching chamber.

Example 12. The method of one of examples 7 to 11, where wet etching the patterned layer includes cleaning the patterned layer using a wet etchant including hydrofluoric acid (HF).

Example 13. The method of one of examples 7 to 12, where the mask protection structure is a sacrificial structure that is consumed while dry etching the liner.

Example 14. The method of one of examples 7 to 13, where the patterned layer includes a hardmask that is used as at least part of the etch mask while dry etching the liner, and where wet etching the patterned layer also removes any remaining portions of the hardmask.

Example 15. The method of one of examples 7 to 14, further including: repeating the steps of forming the conformal protection layer, forming the mask protection structure, and dry etching the liner as a cycle before wet etching the patterned layer.

Example 16. A method of etching a ceramic liner formed between a patterned ruthenium interconnect layer and a silicon-containing substrate, the method including: forming an atomic layer deposition (ALD) protection layer over the ceramic liner, the patterned ruthenium interconnect layer, and a hardmask formed thereon; forming a silicon-containing mask protection structure selectively over upper surfaces of features of the hardmask; dry etching the ceramic liner to expose the silicon-containing substrate using the silicon-containing mask protection structure and the hardmask as a liner etch mask using plasma including boron and chlorine or including a fluorocarbon; and cleaning the patterned ruthenium interconnect layer to remove the ALD protection layer using a wet etchant.

Example 17. The method of example 16, where forming the ALD protection layer, forming the silicon-containing mask protection structure, and dry etching the ceramic liner are performed in situ in an etching chamber.

Example 18. The method of one of examples 16 and 17, further including: dry etching a ruthenium layer to form the patterned ruthenium interconnect layer using the hardmask as an interconnect etch mask and using plasma including a halogen.

Example 19. The method of example 18, where dry etching the ruthenium layer, forming the ALD protection layer, forming the silicon-containing mask protection structure, and dry etching the ceramic liner are performed in situ in an etching chamber.

Example 20. The method of one of examples 16 to 19, further including: repeating the steps of forming the ALD protection layer, forming the silicon-containing mask protection structure, and dry etching the ceramic liner as part of a cycle before cleaning the patterned ruthenium interconnect layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of etching an electrically conductive liner formed between a patterned layer and a substrate, the method comprising:

forming a conformal protection layer over the patterned layer and the electrically conductive liner, the patterned layer comprising a plurality of interconnects spaced apart from one another over the electrically conductive liner;

dry etching the electrically conductive liner to expose the substrate between the interconnects using the patterned layer as an etch mask, portions of the electrically conductive liner remaining between the interconnects and the substrate and electrically coupling the interconnects to the substrate, and the conformal protection layer remaining along sidewalls of the interconnects during the dry etching; and wet etching and removing the conformal protection layer.

2. The method of claim 1, further comprising:

forming a mask protection structure over the patterned layer and the electrically conductive liner to extend features of the patterned layer before dry etching the electrically conductive liner, wherein dry etching the electrically conductive liner comprises using the mask protection structure as at least part of the etch mask, and wherein wet etching and removing the conformal protection layer also removes any remaining portions of the mask protection structure.

3. The method of claim 1, wherein forming the conformal protection layer and dry etching the electrically conductive liner are performed in situ in an etching chamber.

4. The method of claim 1, wherein wet etching and removing the conformal protection layer comprises cleaning the patterned layer using a wet etchant comprising hydrofluoric acid (HF).

5. The method of claim 1, further comprising:

repeating the steps of forming the conformal protection layer and dry etching the electrically conductive liner as a cycle before wet etching and removing the conformal protection layer.

6. The method of claim 1, wherein the patterned layer further comprises a hardmask overlying the interconnects, wherein dry etching the electrically conductive liner comprises using the hardmask as at least part of the etch mask, and wherein wet etching and removing the conformal protection layer also removes any remaining portions of the hardmask.

7. A method of etching a liner formed between a patterned layer and a substrate, the method comprising:

forming a conformal protection layer over the patterned layer and the liner;

forming a mask protection structure on upper surfaces of features of the patterned layer, the mask protection structure being selectively formed on the upper surfaces such that sidewalls of the features are substantially free of the mask protection structure;

dry etching the liner to expose the substrate using the mask protection structure as an etch mask; and wet etching and removing the conformal protection layer.

8. The method of claim 7, wherein forming the conformal protection layer is performed before forming the mask protection structure.

9. The method of claim 7, wherein forming the mask protection structure is performed before forming the conformal protection layer.

10. The method of claim 7, wherein the patterned layer is a patterned ruthenium interconnect layer.

11. The method of claim 7, wherein forming the conformal protection layer, forming the mask protection structure, and dry etching the liner are performed in situ in an etching chamber.

12. The method of claim 7, wherein wet etching and removing the conformal protection layer comprises cleaning the patterned layer using a wet etchant comprising hydrofluoric acid (HF).

13. The method of claim 7, wherein the mask protection structure is a sacrificial structure that is consumed while dry etching the liner.

14. The method of claim 7, wherein the patterned layer comprises a hardmask that is used as at least part of the etch mask while dry etching the liner, and wherein wet etching and removing the conformal protection layer also removes any remaining portions of the hardmask.

15. The method of claim 7, further comprising:

repeating the steps of forming the conformal protection layer, forming the mask protection structure, and dry etching the liner as a cycle before wet etching and removing the conformal protection layer.

16. A method of etching a ceramic liner formed between a patterned ruthenium interconnect layer and a silicon-containing substrate, the method comprising:

forming an atomic layer deposition (ALD) protection layer over the ceramic liner, the patterned ruthenium interconnect layer, and a hardmask formed thereon;

forming a silicon-containing mask protection structure selectively over upper surfaces of features of the hardmask;

dry etching the ceramic liner to expose the silicon-containing substrate using the silicon-containing mask protection structure and the hardmask as a liner etch mask using plasma comprising boron and chlorine or comprising a fluorocarbon; and cleaning the patterned ruthenium interconnect layer to remove the ALD protection layer using a wet etchant.

17. The method of claim 16, wherein forming the ALD protection layer, forming the silicon-containing mask protection structure, and dry etching the ceramic liner are performed in situ in an etching chamber.

18. The method of claim 16, further comprising:

repeating the steps of forming the ALD protection layer, forming the silicon-containing mask protection structure, and dry etching the ceramic liner as part of a cycle before cleaning the patterned ruthenium interconnect layer.

19. The method of claim 16, further comprising:

dry etching a ruthenium layer to form the patterned ruthenium interconnect layer using the hardmask as an interconnect etch mask and using a plasma comprising a halogen.

20. The method of claim 19, wherein dry etching the ruthenium layer, forming the ALD protection layer, forming the silicon-containing mask protection structure, and dry etching the ceramic liner are performed in situ in an etching chamber.

* * * * *